United States Patent
Uemura

(10) Patent No.: US 7,006,201 B2
(45) Date of Patent: Feb. 28, 2006

(54) PHOTOSENSITIVE TABULAR MEMBER SUCTION MECHANISM AND IMAGE RECORDING DEVICE

(75) Inventor: Hiroshi Uemura, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 43 days.

(21) Appl. No.: 10/864,873

(22) Filed: Jun. 10, 2004

(65) Prior Publication Data

US 2005/0012919 A1 Jan. 20, 2005

(30) Foreign Application Priority Data

Jun. 10, 2003 (JP) ............................. 2003-165290

(51) Int. Cl.
*G03B 27/60* (2006.01)
*B41J 2/435* (2006.01)
*B25B 11/00* (2006.01)

(52) U.S. Cl. ...................... 355/73; 347/262; 347/264; 269/21

(58) Field of Classification Search .................. 355/72, 355/73, 91; 269/21; 347/262, 264
See application file for complete search history.

(56) References Cited

U.S. PATENT DOCUMENTS 5,471,279 A * 11/1995 Takizawa ...................... 355/73
6,597,432 B1 * 7/2003 Ida ............................... 355/73
6,721,035 B1 * 4/2004 Segers et al. .................. 355/53

FOREIGN PATENT DOCUMENTS

JP 03-073289 A 3/1991
JP 06-345279 A 12/1994

* cited by examiner

*Primary Examiner*—Alan Mathews
(74) *Attorney, Agent, or Firm*—Sughrue Mion, PLLC

(57) ABSTRACT

A photosensitive tabular member suction mechanism that can reliably suck with a simple configuration, on a stage, photosensitive tabular members of different sizes by effectively using the suction force resulting from negative pressure, and an image recording device disposed with this photosensitive tabular member suction mechanism. Cylinder members are attached inside the stage in correspondence to respective suction holes, and the piston members accommodated in the suction holes are urged upward by springs. In a state where a substrate is not placed on a placement surface of the stage, the piston members are in a closed position due to the urging force of the springs and block off the suction holes. When the substrate is placed on the placement surface, the piston members move to an open position counter to the urging force of the springs and the suction holes are opened, whereby the substrate is sucked by a suction force resulting from negative pressure.

20 Claims, 13 Drawing Sheets

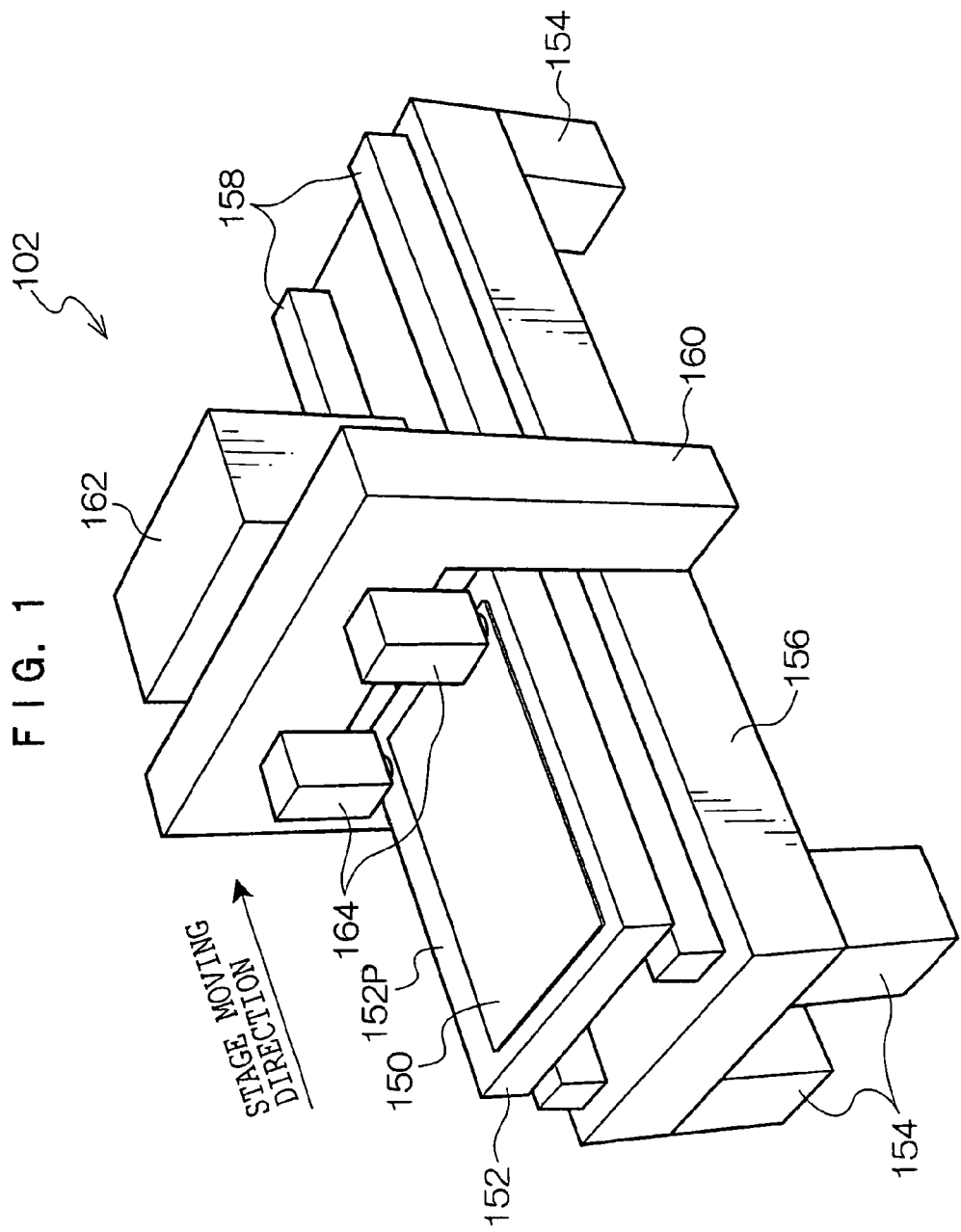

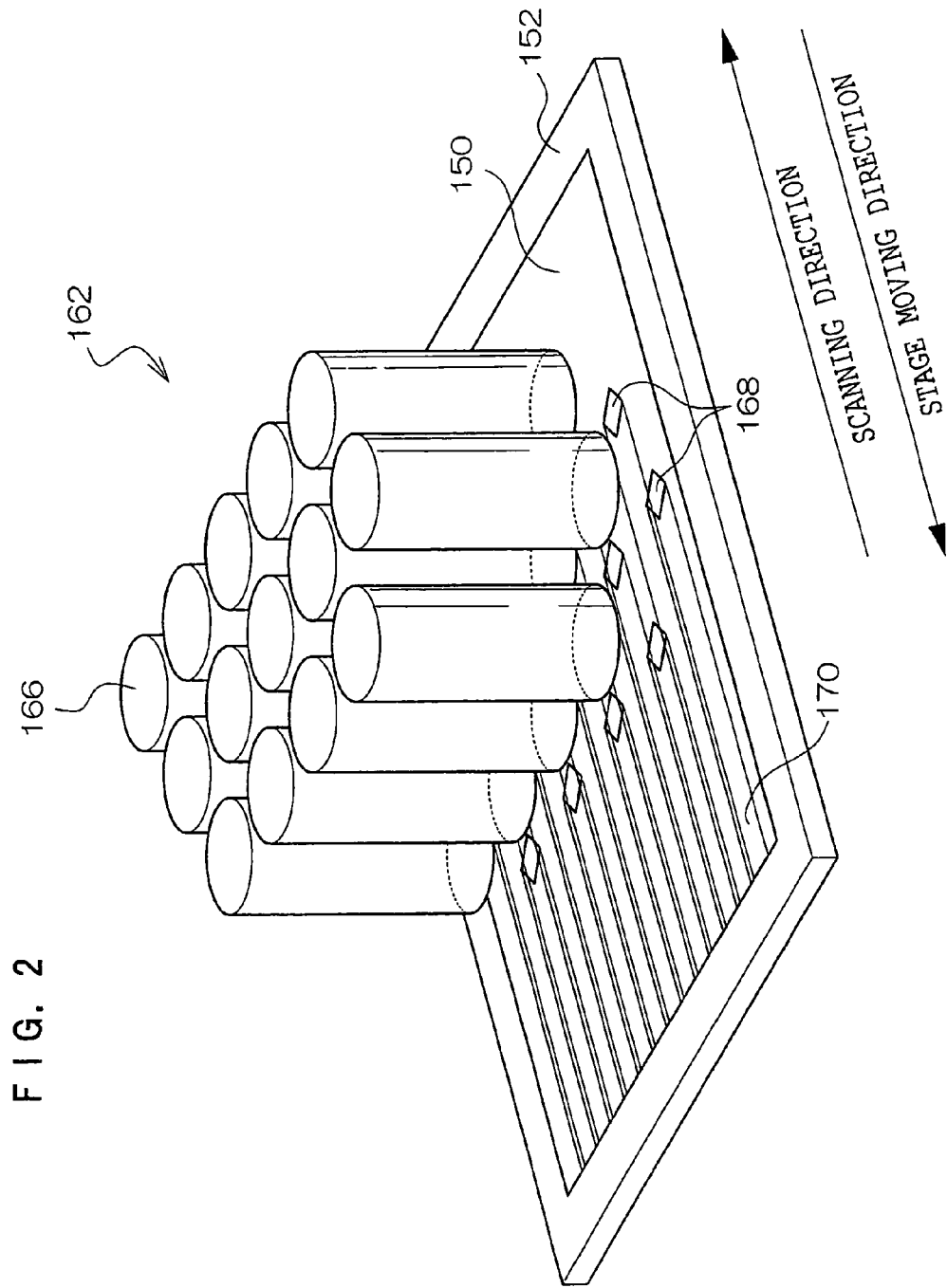

F I G. 7A
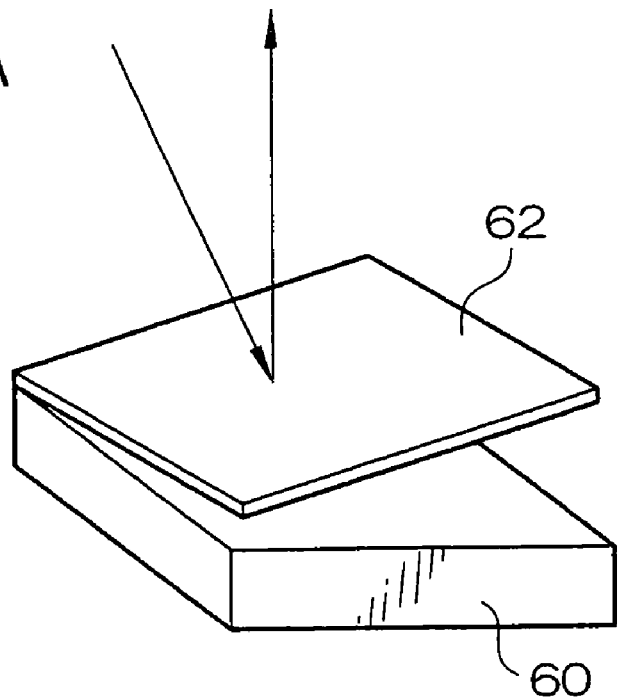
F I G. 7B
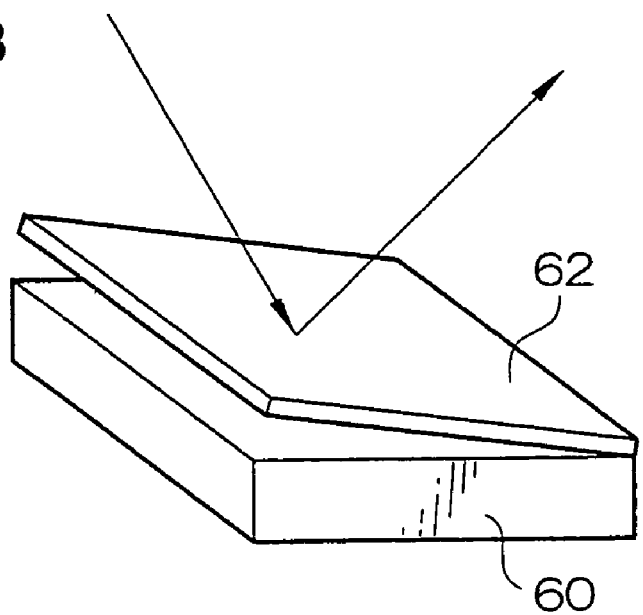

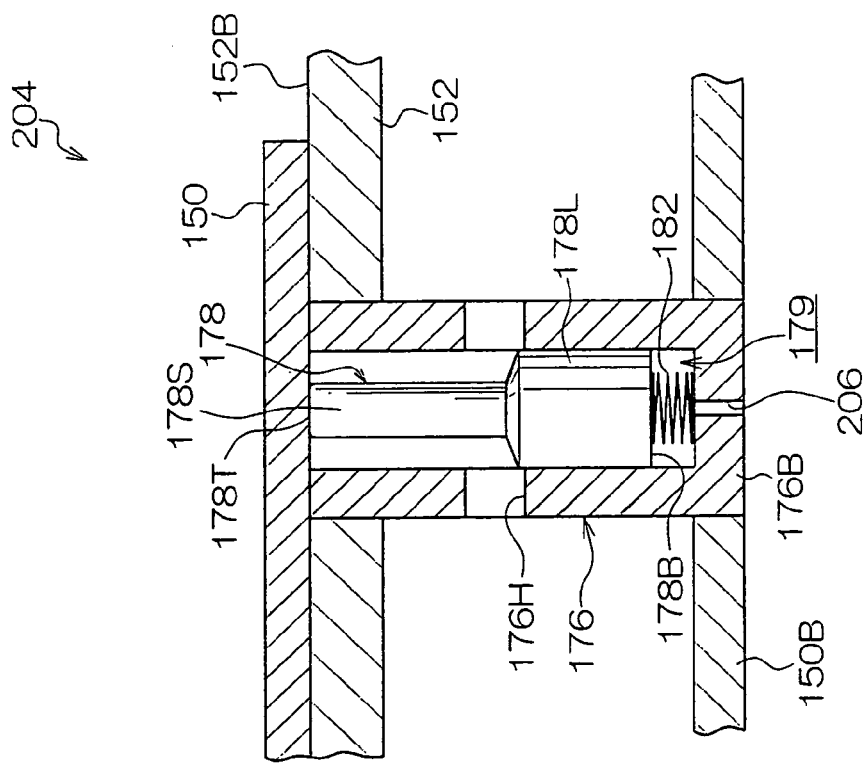
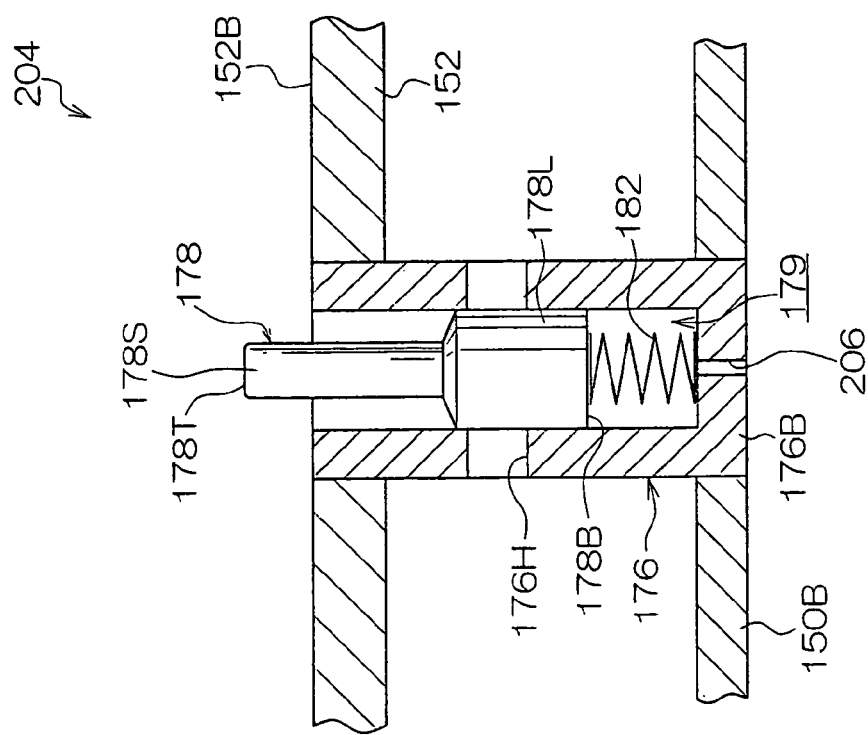

1

PHOTOSENSITIVE TABULAR MEMBER SUCTION MECHANISM AND IMAGE RECORDING DEVICE

CROSS-REFERENCE TO RELATED APPLICATION

This application claims priority under 35 USC 119 from Japanese Patent Application No. 2003-165290, the disclosure of which is incorporated by reference herein.

BACKGROUND OF THE INVENTION

1. Field of the Invention

The present invention relates to a photosensitive tabular member suction mechanism and an image recording device.

2. Description of the Related Art

Among image recording devices where a photosensitive tabular member is placed on a stage and a desired pattern is recorded, there is a device of a configuration where plural suction holes are formed in a placement surface of the stage and the photosensitive tabular member placed on the placement surface is sucked and retained by negative pressure.

However, because there is so-called air leakage from the periphery of the photosensitive tabular member placed on the placement surface, devices such as a larger vacuum pump and blower become necessary in order to obtain a sufficient suction force.

Also, in this configuration, the plural suction holes are dispersed in a wide range of the placement surface to match the maximum-size photosensitive tabular member of photosensitive tabular members of plural sizes that become the targets of image recording. Thus, in a case where a photosensitive tabular member of a smaller size is sucked, pressure inside the sucking stage rises (i.e., reduction in negative pressure), and there is the potential for a sufficient suction force to not be obtained because the suction holes positioned at the outer sides of the photosensitive tabular member are not blocked by the photosensitive tabular member and air flows in from these.

In order to eliminate this drawback, a method is conceivable where the unused suction holes at the outer side regions of the photosensitive tabular member are covered (blocked) with a film. However, with this method, it is necessary to prepare and adhere, to the placement surface, films of shapes corresponding to each of the different sizes of the photosensitive tabular materials, which is troublesome.

With respect thereto, Japanese Patent Application Laid-Open Publication (JP-A) No. 6-345279 discloses an exposure device of a configuration where the inside of the stage is separated into plural suction areas to match the sizes of substrates that are the photosensitive tabular members, tubes are divided, suction valves are switched to match the substrate size, and the substrate is sucked in a suction area of a size smaller than that of the substrate. However, with this configuration, the internal structure of the stage becomes complicated and the accommodatable substrate sizes are limited.

JP-A No. 3-73289 discloses a suction/retention mechanism configured so that the suction holes not covered by the substrate are closed by the deformation of a diaphragm or cylindrical elastic body. However, with this configuration, it is necessary to cause the suction force to act in order to also close the unused suction holes because the device is configured to cause the diaphragm or cylindrical elastic body to deform with the negative pressure inside the stage, and the suction force resulting from the negative pressure inside the stage cannot be used effectively.

SUMMARY OF THE INVENTION

It is an object of the present invention to obtain a photosensitive tabular member suction mechanism that can reliably suck, on a stage, photosensitive tabular members of different sizes by effectively using the suction force resulting from negative pressure, and an image recording device disposed with this photosensitive tabular member suction mechanism.

In order to achieve this object, according to a first aspect of the invention, there is provided a suction mechanism for retaining a photosensitive tabular member including: (a) a stage that includes an upper surface for placing the photosensitive tabular member, a suction path at least partially disposed along the stage, and plural suction holes that are connected to the suction path and are defined in the stage upper surface; (b) a suction unit that is connected to the suction path and is operable for applying a reduced pressure to the suction path; and (c) mechanically-operated valve members disposed in the respective suction holes, with each valve member being capable of moving between an open position that substantially allows a fluid connection between the stage upper surface side and the suction path and a closed position that substantially blocks the fluid connection, (d) wherein when the photosensitive tabular member is placed on the stage upper surface, only the valve members positioned in a projection region of the photosensitive tabular member on the stage upper surface move to the closed position on the basis of at least one of the self weight of the photosensitive tabular member and an external force applied to the photosensitive tabular member.

According to another aspect of the invention, there is provided an image recording device for recording an image on a photosensitive tabular substrate including: (a) a stage for retaining the substrate during image recording, the stage including an upper surface for placing the substrate, a suction path at least partially disposed along the stage, and plural suction holes that are connected to the suction path and are defined in the stage upper surface; (b) a suction unit that is connected to the suction path and is operable for applying a reduced pressure to the suction path; and (c) mechanically-operated valve members disposed in the respective suction holes, with each valve member being capable of moving between an open position that substantially allows a fluid connection between the stage upper surface side and the suction path and a closed position that substantially blocks the fluid connection, (d) wherein when the substrate is placed on the stage upper surface, only the valve members positioned in a projection region of the substrate on the stage upper surface move to the closed position on the basis of at least one of the self weight of the substrate and an external force applied to the substrate.

Other objects, features and advantages of the present invention will be apparent to those skilled in the art from the explanation of the preferred embodiments of the present invention illustrated in the appended drawings, and from the appended claims.

BRIEF DESCRIPTION OF THE DRAWINGS

FIG. 1 is a perspective view showing the exterior of an image recording device of a first embodiment of the invention;

FIG. 2 is a perspective view showing the configuration of a scanner of the image recording device of the first embodiment of the invention;

FIGS. 7A and 7B are explanatory views for describing the operation of the DMD pertaining to the exposure head of the first embodiment of the invention;

FIGS. 10A and 10B are cross-sectional views showing a substrate suction mechanism of a second embodiment of the invention, with FIG. 10A showing a state where a substrate is not placed thereon and FIG. 10B showing a state where a substrate is placed thereon;

DETAILED DESCRIPTION OF THE INVENTION

Figure 8:
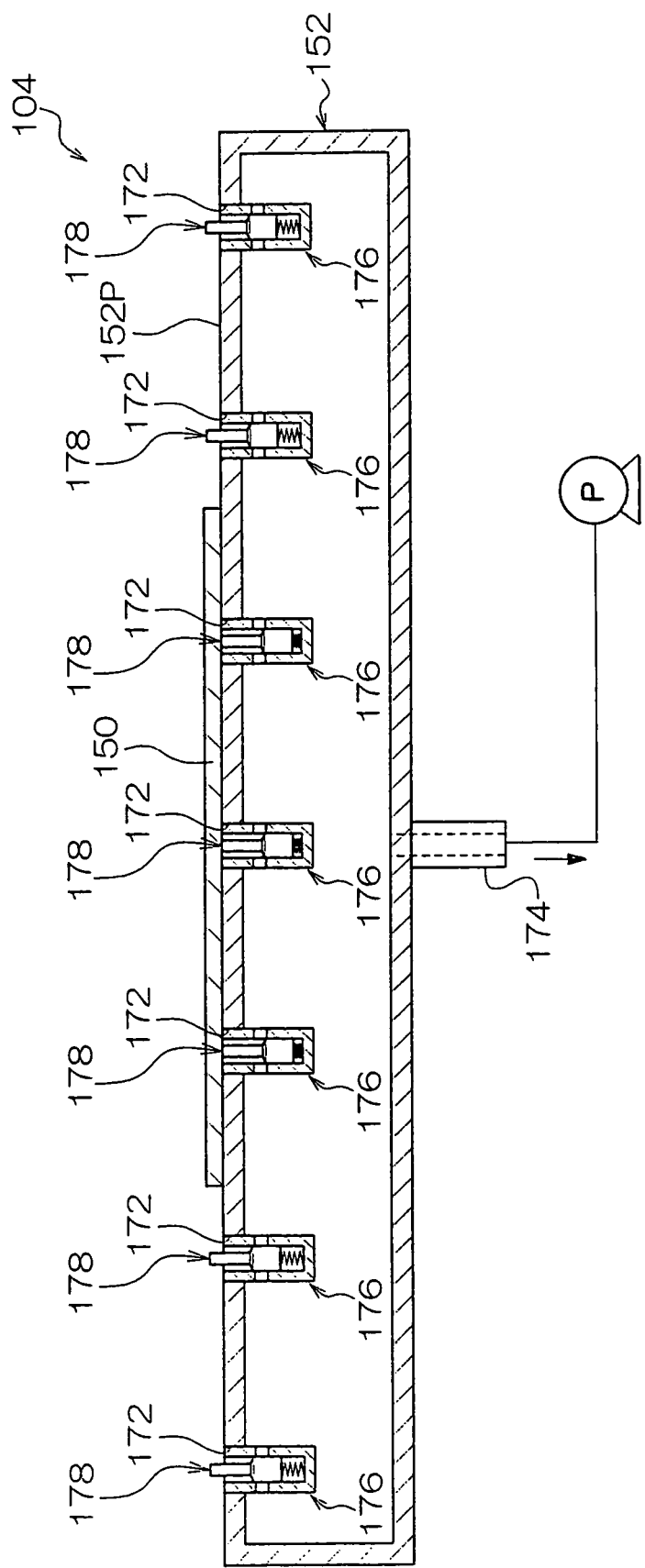
FIG. 8 is a cross-sectional view showing a stage disposed with a substrate suction mechanism of the first embodiment of the invention.
Figure 9A:
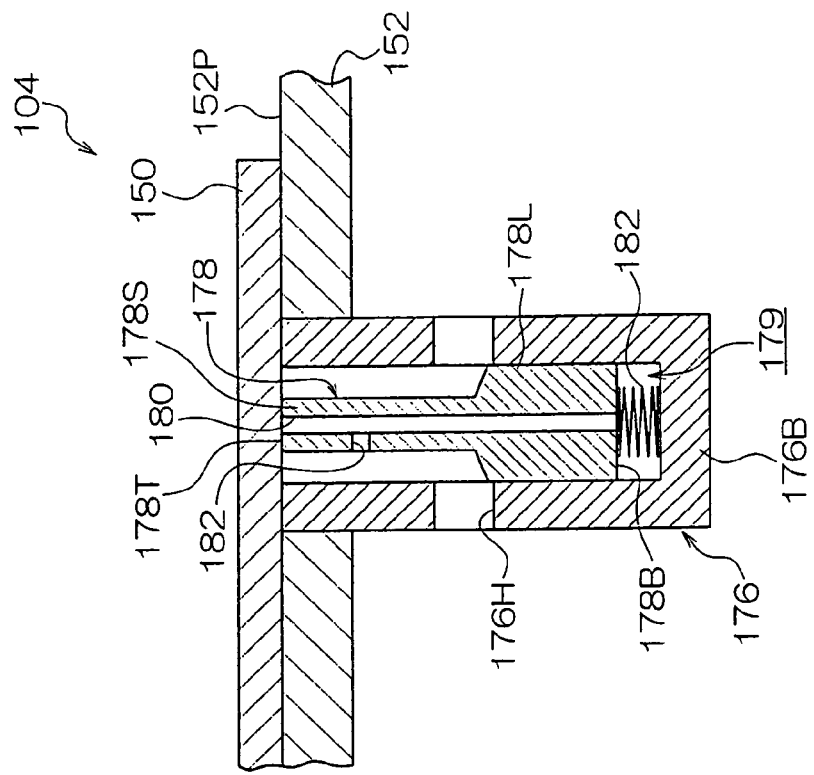
FIGS. 9A and 9B are cross-sectional views showing the substrate suction mechanism of the first embodiment of the invention, with FIG. 9A showing a state where a substrate is not placed thereon and FIG. 9B showing a state where a substrate is placed thereon.
Figure 9B:
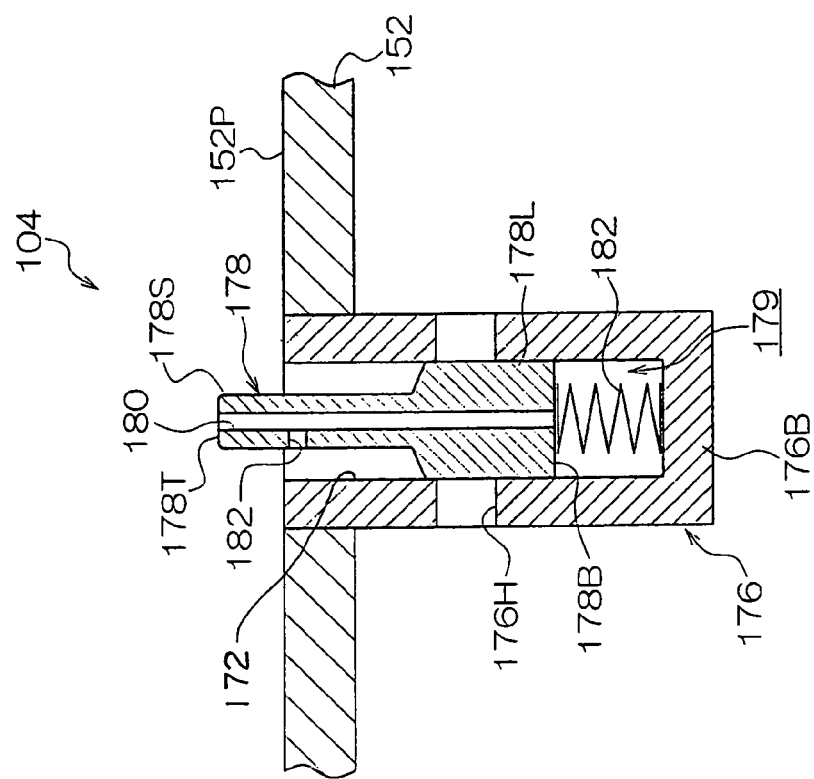

FIG. 8 and FIGS. 9A and 9B show a substrate suction mechanism 104 of a first embodiment of the invention. Also, FIG. 1 shows an image recording device 102 disposed with this substrate suction mechanism 104.

The image recording device 102 is a so-called flatbed type. As shown in FIG. 1, the image recording device 102 is disposed with a stage 152 that sucks and retains, on a surface thereof (placement surface 152P), a substrate 150 that is an example of a photosensitive tabular member. Two guides 158 that extend along the stage moving direction are disposed on an upper surface of a tabular table 156 supported by leg portions 154. The stage 152 is supported by the guides 158 so as to be capable of reciprocal movement and is disposed so that the stage longitudinal direction is in the stage moving direction. The image recording device 102 is also disposed with a drive device (not shown) for driving the stage 152 along the guides 158 and a controller (not shown) that controls the stage 152 so that the stage 152 moves in a scanning direction at a desired moving speed (scanning speed).

A gate 160 is disposed at a central portion of the table 156 so as to straddle the movement path of the stage 152. End portions of the substantially U-shaped gate 160 are fixed to both side surfaces of the table 156. A scanner 162 is disposed at one side of the gate 160, and plural (e.g., two) detection sensors 164 that detect the leading end and trailing end of the substrate 150 are disposed at the other side of the gate 160, so that the gate 160 is disposed between the laser scanner 162 and the detection sensors 164. The scanner 162 and the detection sensors 164 are respectively attached to the gate 160 and fixed above the movement path of the stage 152. It should be noted that the laser scanner 162 and the detection sensors 164 are connected to an unillustrated controller that controls them and, as will be described later, are controlled so that the substrate 150 is exposed at a predetermined timing when the substrate 150 is exposed by exposure heads 166.

The detection sensors 164 are disposed with strobes (not shown) as light sources at the time of shooting whose one-time light emission time is extremely short, and the light-receiving sensitivity thereof is set so that shooting becomes possible only when the strobes are emitted.

When the stage 152 passes a shooting position directly below the detection sensors 164, the detection sensors 164 emit the strobes at a predetermined timing and receive the reflected light of the light from the strobes, whereby the detection sensors 164 respectively shoot shooting ranges including alignment marks formed on the substrate 150. Also, positional adjustment of the detection sensors 164 along the width direction is possible in correspondence to the positions of the alignment marks.

The scanner 162 is supported by the gate 160 so as to be capable of positional adjustment in the scanning direction. Thus, it is possible to adjust, within a predetermined range, the distance between the shooting position resulting from the detection sensors 164 and the exposure position resulting from the scanner 162.

Figure 3A:
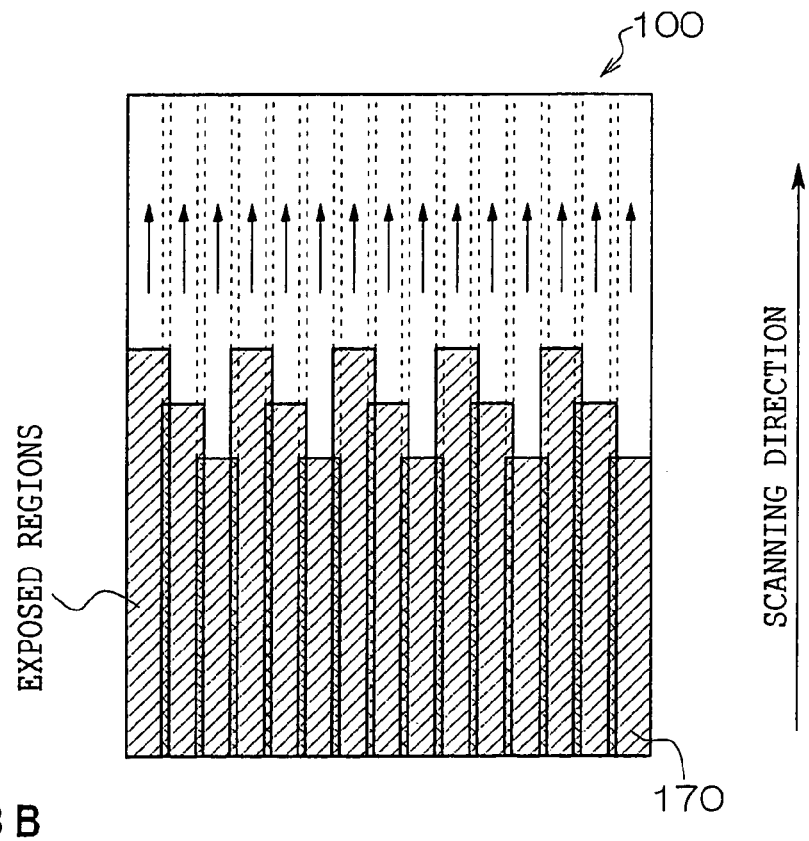
FIG. 3A is a plan view showing exposed regions formed on a photosensitive material.
Figure 3B:
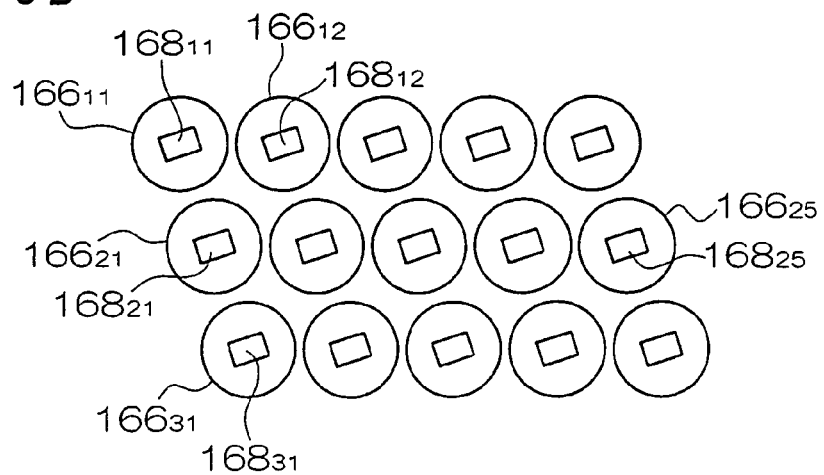
FIG. 3B is a view showing the arrangement of exposure areas resulting from exposure heads.

As shown in FIG. 2 and FIG. 3B, the scanner 162 is disposed with plural exposure heads 166 arranged in a substantial matrix of m rows and n columns (e.g., three rows and five columns). In this example, five exposure heads 166 are disposed in the first and second rows and four exposure heads 166 are disposed in the third row, due to the relation with the width of the substrate 150, so that there are fourteen exposure heads 166 overall. It should be noted that, when indicating an individual exposure head arranged in m-th row and n-th column, that particular exposure head will be indicated as "exposure head $166_{mn}$".

Exposure areas 168 resulting from the exposure heads 166 have rectangular shapes which take the scanning direction as short edges, and are slanted at a predetermined inclination angle with respect to the heads and direction. Thus, a band-like exposed region 170 is formed per exposure head 166 on the substrate 150 in accompaniment with the movement of the stage 152. It should be noted that, when indicating an exposure area resulting from an exposure head arranged in m-th row and n-th column, that particular exposure area will be indicated as "exposure area $168_{mn}$".

As shown in FIGS. 3A and 3B, the exposure heads in the linearly arranged rows are disposed offset by predetermined intervals in head and direction so that the band-like exposed regions 170 partially overlap with their adjacent exposed regions 170. For this reason, the portion that cannot be exposed between exposure area $168_{11}$ and exposure area $168_{12}$ in the first row can be exposed by exposure area $168_{21}$ in the second row and exposure area $168_{31}$ in the third row.

Figure 4:
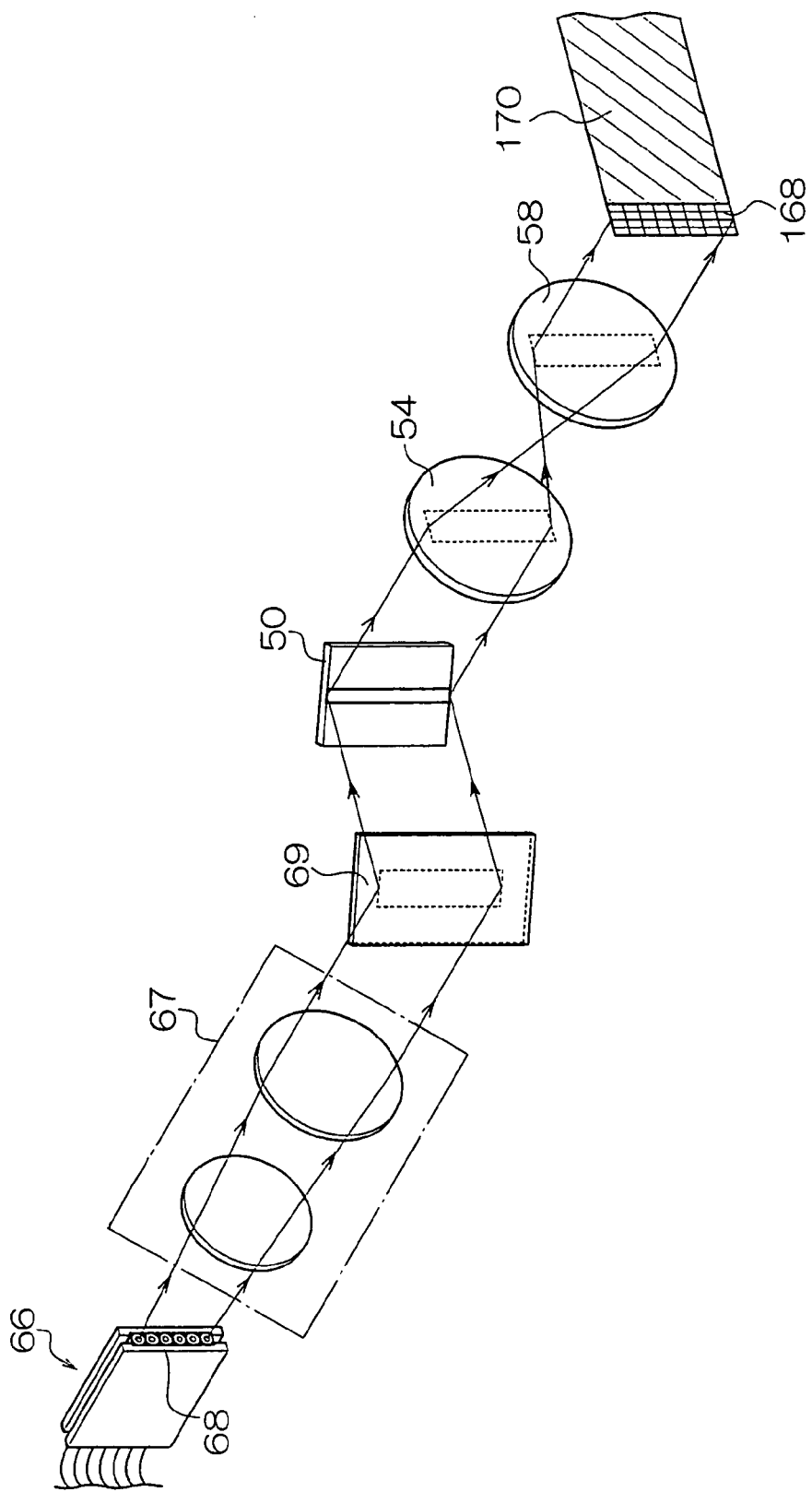
FIG. 4 is a perspective view showing the schematic configuration of the exposure head of the first embodiment of the invention.
Figure 5A:
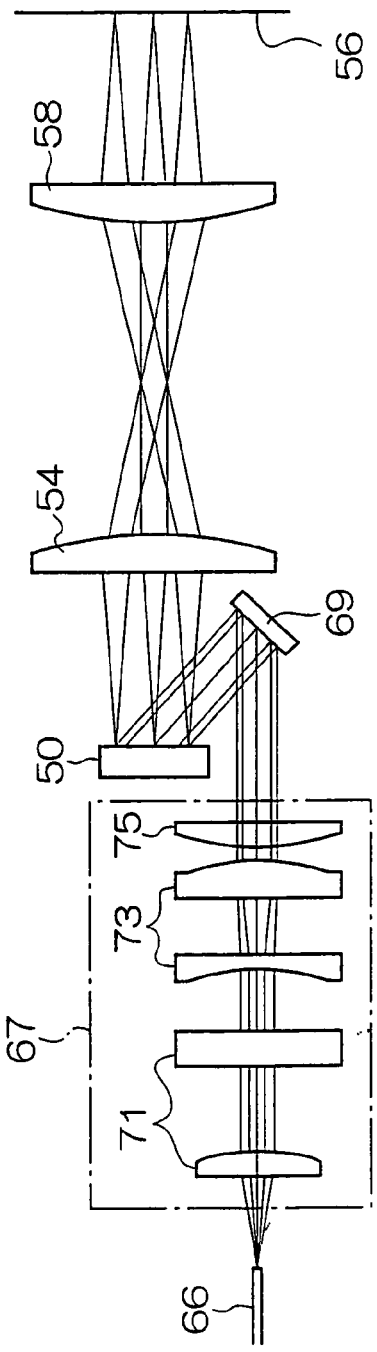
FIG. 5A is a cross-sectional view, in a subscanning direction along an optical axis, showing the configuration of the exposure head shown in FIG. 4.
Figure 5B:
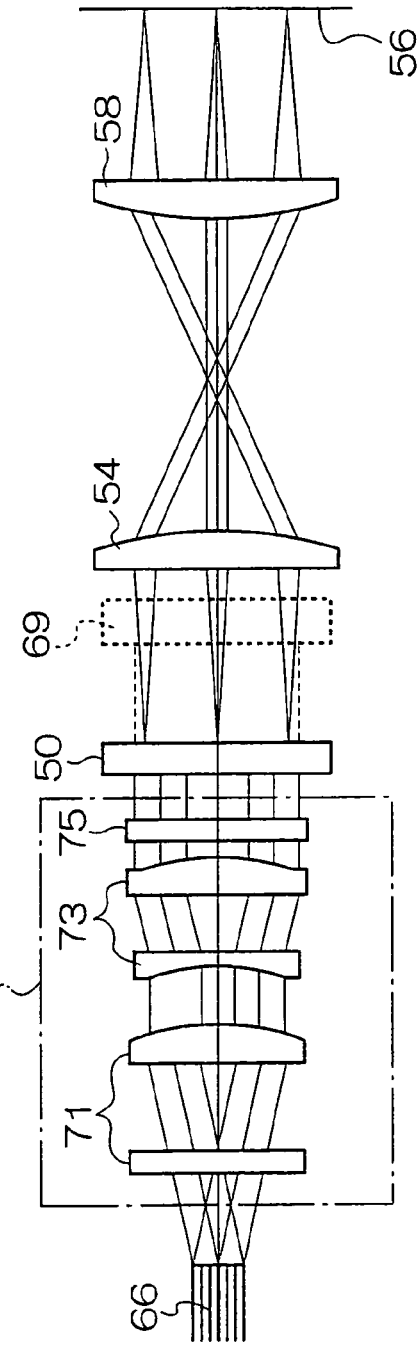
FIG. 5B is a side view of FIG. 5A.

As shown in FIG. 4 and FIGS. 5A and 5B, each exposure head $166_{11}$ to $166_{mn}$ is disposed with a digital micromirror device (DMD) 50 as a spatial light modulator that modulates, per pixel, incident light beams in correspondence to image data. The DMD 50 is connected to an unillustrated controller disposed with a data processor and a mirror drive controller. The data processor of the controller generates control signals that drive/control the micromirrors inside the region of the DMD to be controlled per exposure head 166 on the basis of inputted image data.

The mirror drive controller controls the angles of reflection surfaces of the micromirrors of the DMD 50 per exposure head 166 on the basis of the control signals generated by the image data processor.

Disposed in the following order at the light incident side of the DMD 50 are a fiber array light source 66 disposed with a laser emission portion where emission end portions (light-emitting points) of optical fibers are arranged in one row along a direction corresponding to the long edge direction of the exposure areas 168, a lens system 67 that corrects the laser light emitted from the fiber array light source 66 and condenses the laser light onto the DMD, and a mirror 69 that reflects the laser light transmitted through the lens system 67 towards the DMD 50.

The lens system 67 includes a pair of combination lenses 71 that make parallel the laser light emitted from the fiber array light source 66, a pair of combination lenses 73 that correct the laser light so that the light amount distribution of the made-parallel laser light becomes uniform, and a condenser lens 75 that condenses, onto the DMD, the laser light whose light amount distribution has been corrected.

The combination lenses 73 are disposed with the function of widening light beams at portions near the optical axis of the lenses and narrowing light beams at portions away from the optical axis with respect to the arrangement direction of the laser emission ends and allowing light to be transmitted therethrough as is with respect to the direction orthogonal to the arrangement direction. The combination lenses 73 correct the laser light so that the light amount distribution becomes uniform.

Lens systems 54 and 58 that image, onto a scanning surface (exposure surface) 56 of the substrate 150, the laser light reflected by the DMD 50 are disposed at the light-reflecting side of the DMD 50. The lens systems 54 and 58 are disposed so that the DMD 50 and the exposure surface 56 are in a conjugate relation.

In the present embodiment, the laser light emitted from the fiber array light source 66 is set so that, after it is magnified substantially fivefold, respective pixels are narrowed to about 5 μm by the lens systems 54 and 58.

Figure 6:
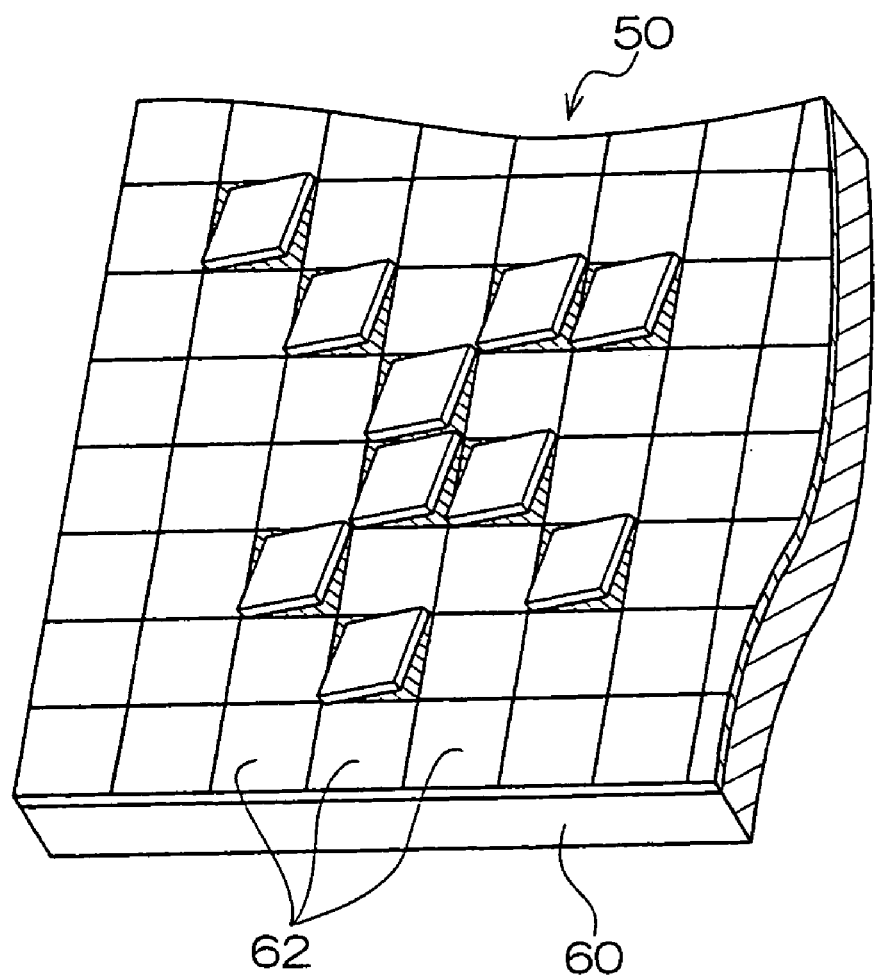
FIG. 6 is a partially enlarged view showing the configuration of a digital micromirror device (DMD) pertaining to the exposure head of the first embodiment of the invention.

As shown in FIG. 6, the DMD 50 is one where micromirrors 62 are supported by supports and disposed on a SRAM cell (memory cell) 60. The DMD 50 is a mirror device configured by numerous (e.g., pitch 13.68 μm, 1024×768) micromirrors configuring pixels that are arranged in a grid. The micromirrors 62 supported by supports at the uppermost portion are disposed in each pixel, and a material having a high reflectivity, such as aluminium, is deposited on the surfaces of the micromirrors 62. The reflectivity of the micromirrors 62 is 90% or higher. Disposed directly below the micromirrors 62 is the SRAM cell 60 of a silicon gate CMOS produced in a production line of ordinary semiconductor memories via the supports including a hinge and a yoke. Overall, the DMD 50 is configured monolithically.

When a digital signal is written to the SRAM cell 60 of the DMD 50, the micromirrors 62 supported by the supports are slanted in a range of ±α degrees (e.g., ±10 degrees) with respect to the substrate side at which the DMD 50 is disposed around a diagonal. FIG. 7A shows a state where a micromirror 62 is slanted at +α degrees, which is an ON state, and FIG. 7B shows a state where a micromirror 62 is slanted at −α degrees, which is an OFF state. Thus, by controlling the inclination of the micromirrors 62 of the pixels of the DMD 50 in correspondence to an image signal as shown in FIG. 6, the light made incident at the DMD 50 is reflected in the respective directions in which the micromirrors 62 are slanted.

FIG. 6 shows an example where part of the DMD 50 is enlarged and a state where the micromirrors 62 are controlled to have inclinations of +α degrees or −α degrees. The ON-OFF control of the micromirrors 62 is conducted by the unillustrated controller connected to the DMD 50. A light absorber (not shown) is disposed in the direction in which the light beams are reflected by the micromirrors 62 in the ON state.

FIG. 8 shows the stage 152 of the present embodiment. The stage 152 is formed in a hollow, flat box-shape, and the upper surface thereof serves as the placement surface 152P on which the substrate 150 is placed. The size of the placement surface 152P is made into a size where the largest substrate serving as the target of image recording by the image recording device 102 can be placed on the placement surface 152P. Below, a substrate of the largest size serving as the target of image recording in the image recording device 102 will be referred to as "the maximum-size substrate" and a substrate of the smallest size serving as the target of image recording will be referred to as the "minimum-size substrate".

Plural suction holes 172 are formed in the placement surface 152P (in the present embodiment, a matrix of seven rows of suction holes in the stage moving direction and seven columns of suction holes in the stage width direction orthogonal to the stage moving direction is formed, for a total of 49 suction holes). A suction device P (e.g., a vacuum pump) is connected to the stage 152 via a conduit 174 and is configured to be able to suck air from the suction holes 172. When the suction holes 172 are covered by the substrate 150 placed on the placement surface 152P, the substrate 150 is sucked. The suction holes 172 cover a wide enough range to be able to reliably suck the maximum-size substrate and are disposed/configured to have enough surface density to be able to reliably suck even the minimum-size substrate.

As shown in detail in FIGS. 9A and 9B, bottomed cylinder members 176 are attached inside the stage 152 in correspondence to the suction holes 172. A continuous hole 176H is formed in the side surface of each cylinder member 176, so that the inside of each cylinder member 176 communicates with the outside (inside of the stage 152).

A piston member 178 is accommodated inside the cylinder member 176 so as to be movable in the axial direction thereof, and the space between the piston member 178 and the cylinder member 176 is sealed so that air does not inadvertently flow therethrough. The space between a bottom panel 176B of the cylinder member 176 and a bottom surface 178B of the cylinder member 178 is formed as a spring chamber 179. A compression coil spring 182 fixed to the bottom panel 176B inside the spring chamber 179 urges the piston member 178 in a direction (upward) in which the piston member 178 protrudes from the placement surface 152P.

The piston member 178 includes a small diameter portion 178S at the placement surface 152P side and a large diameter portion 178L at the bottom panel 176B side of the cylinder member 176. As shown in FIG. 9A, part of the small diameter portion 178S is made to protrude from the placement surface 152P by the urging force of the compression coil spring 182. As shown in FIG. 9B, the length of the piston member 178 is set so that, when the piston member 178 moves downward counter to the urging force of the compression coil spring 182, a tip 178T of the small diameter portion 178S becomes even with the placement surface 152P (or sinks lower inside the cylinder member 176 than the placement surface 152P). The urging force (elastic force) of the compression coil spring 182 is set so that the compression coil spring 182 is sufficiently compressed by the load acting on one piston member 178 when the substrate 150 is placed on the placement surface 152P.

The lengths of the small diameter portion 178S and the large diameter portion 178L are respectively set so that the large diameter portion 178L closes off the continuous hole 176H in a state where the small diameter portion 178S protrudes from the placement surface 152P, as shown in FIG. 9A, and so that the continuous hole 176H is opened by the small diameter portion 178S in a state where the tip 178T of the small diameter portion 178S is even with the placement surface 152P, as shown in FIG. 9B. Thus, the state where the large diameter portion 178L closes off the continuous hole 176H is the closed position of the piston member 178 and the state where the continuous hole 176H is opened by the small diameter portion 178S is the open position of the piston member 178.

An air hole 180 is formed along the axial direction in the center of the piston member 176, and an air hole 182 perpendicular to the air hole 180 is formed in the small diameter portion 178S. Due to these air holes, the spring chamber 179 communicates with the outside of the piston member 178 and with the space between the piston member 178 and the cylinder member 176.

Next, the action of the present embodiment will be described.

First, the substrate 150 is placed on the placement surface 152P of the stage 152 in order to record an image on the substrate 150. The load of the substrate 150 acts on some or all of the piston members 178.

The piston members 178 on which the load of the substrate 150 is not acting are in the closed position, as shown in FIG. 9A, due to the urging force of the compression coil springs 182. For this reason, air does not flow between the inside and the outside of the stage 152 through the suction holes 172.

In contrast, the piston members 178 on which the substrate 150 has been placed are pressed by the load of the substrate 150 (or by a pressing force when the substrate 150 is conveyed and placed thereon) counter to the urging force of the compression coil springs 182 and move to the open position, as shown in FIG. 9B. At this time, resistance resulting from the air pressure of the spring chambers 179 does not occur in the movement of the piston members 178 because the air inside the spring chambers 179 is discharged to the outside (the air may be discharged to the inside or outside of the stage 152) by the air holes 180 and 182.

In this state, the suction device P is driven to create a negative pressure inside the stage 152. Because the suction holes 172 in the region where the substrate 150 has been placed are open, the substrate 150 is sucked by the suction force resulting from the negative pressure. In contrast, because the suction holes 172 in the region at the outer sides of the substrate 150 are closed off by the piston members 178, air is not inadvertently sucked through the suction holes 172. Thus, for example, the substrate 150 can be reliably sucked even in a case where a compact device is used as the suction device P.

Also, because only the suction holes 172 in the region where the substrate 150 has been placed act (are open), the substrate 150 can be sucked on the placement surface 152P of the stage 152 regardless of the size of the substrate 150. The structure of the device also does not become complicated because it is not necessary to dispose, inside the stage 152, suction areas and tubes matching the size of the substrate.

It should be noted that, although the negative pressure inside the stage 152 acts on the piston members 178 in a state where negative pressure has been created inside the stage 152, it acts in a direction orthogonal to the movement direction (vertical direction) of the piston members 178 because the continuous holes 176H are formed in the side surfaces of the cylinder members 176. Thus, the piston members 178 receiving the negative pressure do not inadvertently move to the open position counter to the urging force of the compression coil springs 182 and are reliably maintained in the closed position.

Also, it is not essentially necessary for the tips 178T of the piston members 178 in the open position to contact the substrate 150 even with the placement surface 152P. The substrate 150 can be sucked even if the tips 178T are not in contact with the substrate 150.

The stage 152 at which the substrate 150 is sucked to the placement surface 152P is moved by the drive device at a constant speed downstream from the upstream side of the gate 160 along the guides 158.

When the alignment marks reach the shooting position of the detection sensors 164, the unillustrated controller causes the strobes to be emitted and causes the detection sensors 64 to shoot the shooting region including the alignment marks. At this time, shooting information obtained by the detection sensors 164 is outputted to the image processor, and the image processor converts the shooting information into positional information corresponding to the positions of the alignment marks along the scanning direction and the width direction and outputs this positional information to the controller.

On the basis of the positional information of the alignment marks from the image processor, the controller respectively determines the positions of the plural alignment marks disposed in correspondence to one plotting region and, from the positions of the alignment marks, and respectively determines the position of the plotting region along the scanning direction and the width direction and the inclination amount of the plotting region with respect to the scanning direction.

Thereafter, the controller calculates the timing of exposure initiation with respect to the plotting region on the basis of the position of the plotting region along the scanning direction, executes conversion processing with respect to image information corresponding to the plotting pattern on the basis of the position of the plotting region along the width direction and the inclination amount of the plotting region with respect to the scanning direction, and stores the converted image information in a frame memory. Included in the content of the conversion processing are coordinate conversion processing that causes the image information to rotate around a coordinate origin and coordinate conversion processing that causes the image information to move parallel along a coordinate axis corresponding to the width direction. The controller also executes, as needed, conversion processing that decompresses or compresses the image information in correspondence to a compression amount and decompression amount of the plotting region along the width direction and the scanning direction.

The controller outputs an exposure initiation signal to a scanner controller in synchronization with the timing at which the leading end of the plotting region reaches the exposure position. Thus, the scanner controller successively reads, one line at a time, the plotting information stored in the frame memory and generates a control signal for each exposure head 166 on the basis of the image information read by the data processor, whereby the micromirrors of the DMD 50 are ON-OFF controlled per exposure head 166 on the basis of the control signals generated by the mirror drive controller.

When laser light is irradiated from the fiber array light source 66 to the DMD 50, the laser light reflected by the micromirrors of the DMD 50 in the ON state is imaged by the lens systems 54 and 58 onto the exposure surface of the substrate 150. The laser light emitted from the fiber array light source 66 is turned ON-OFF per pixel, and the plotting region of the substrate 150 is exposed in pixel units of substantially the same number as the number of used pixels of the DMD 50. The substrate 150 is moved at a constant speed together with the stage 152, whereby the substrate 150 is subscanned by the scanner 162 in the direction opposite to the stage moving direction and the band-like exposed regions 170 are formed per exposure head 166 (see FIG. 2 and FIG. 3A).

After the conclusion of image recording, the air in the spring chamber 179 flows in through the air holes 180 and 182 when the negative pressure inside the stage 152 is released and becomes the same as the atmospheric pressure, so that, when the substrate 150 is removed from the placement surface 152P, the piston members 178 are moved to the closed position by the urging force of the compression coil springs 182 and close off the suction holes 172.

FIGS. 10A and 10B show a substrate suction mechanism 204 of a second embodiment of the invention. It should be noted that, with respect to constituent elements and members that are substantially identical to those of the first embodiment, identical reference numerals will be given and overlapping description will be appropriately omitted.

The bottom panel 176B of the cylinder member 176 is even with a bottom panel 152B of the stage 152 and is exposed to the outside of the stage 152. Additionally, the substrate suction mechanism 204 does not have the air holes 180 and 182 of the first embodiment; in place thereof, an air hole 206 is formed in the bottom panel 176B.

In the second embodiment also, the air inside the spring chamber 179 can flow to and from the outside through the air hole 206. Whereas the two air holes 180 and 182 were necessary in the first embodiment, only one air hole 206 is needed in the second embodiment, so that the structure can be simplified.

Figure 11:
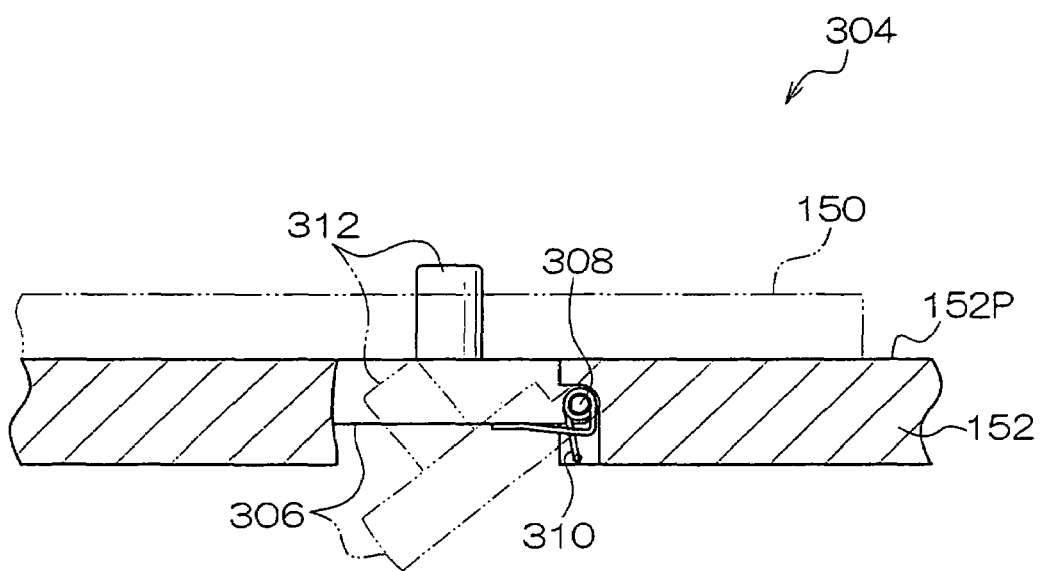
FIG. 11 is a cross-sectional view showing a substrate suction mechanism of a third embodiment of the invention.

FIG. 11 shows a substrate suction mechanism 304 of a third embodiment of the invention. In the third embodiment, a valve member 306 of a shape that can close off the suction hole 172 is disposed in place of the cylinder member 176 and the piston member 178 of the first embodiment.

The valve member 306 is attached to the stage 152 so as to be pivotable around a hinge 308. By pivoting the valve member 306, the valve member 306 moves between a closed position at which the valve member 306 closes off the suction hole 172 (position indicated by the solid line in FIG. 11) and an open position at which the valve member 306 opens the suction hole 172 (position indicated by the two-dot chain line in FIG. 11). A twist coil spring 310 for urging the valve member 306 to the closed position is wound around the hinge 308. A protrusion 312 is formed on the valve member 306. When the protrusion 312 is pushed by the substrate 150 placed on the placement surface 152P, the valve member 306 moves to the open position counter to the urging force of the twist coil spring 310.

In the third embodiment also, the suction holes 172 in the region where the substrate 150 is not placed are closed off by the valve members 306, and the suction holes 172 in the region where the substrate 150 has been placed are open.

It should be noted that, although description was given above in regard to an exposure head disposed with a DMD as a spatial light modulator, a transmissive type spatial light modulator (LCD) can also be used in addition to such a reflective type spatial light modulator. For example, it is also possible to use an MEMS (Micro Electric Mechanical Systems) type spatial light modulator (SLM) or a spatial light modulator other than an MEMS type such as an optical element (PLZT element) that modulates transmitted light using an electro-optical effect and a liquid crystal shutter array such as a ferroelectric liquid crystal (FLC) shutter.

MEMS is a general term for Microsystems where micro-sized sensors, actuators and control circuits resulting from micromachining technology based on an IC fabrication process are integrated.

By MEMS type spatial light modulator is meant a spatial light modulator that is driven by electromechanical operation using an electrostatic force. Moreover, a modulator configured by plural grating light valves (GLV) being two-dimensionally lined up can also be used.

With a configuration using a reflective type spatial light modulator (GLV) or a transmissive type spatial light modulator (LCD), it is possible to use a lamp as a light source in addition to the aforementioned laser.

Also, although description was given in the above embodiments in regard to an example using a fiber array light source disposed with plural multiplexer laser light sources, the laser device is not limited to a fiber array light source where multiplexer laser light sources are disposed in an array. For example, a fiber array light source where fiber light sources disposed with one optical fiber that emits laser light made incident from a single semiconductor laser including one light-emitting point are disposed in an array can be used.

Moreover, a light source where plural light-emitting points are two-dimensionally arranged (e.g., an LD array, an organic EL array, etc.) can be used. With a configuration using such light sources, it becomes possible to omit the aforementioned spatial modulator by making the respective light-emitting points correspond to the pixels.

Figure 12:
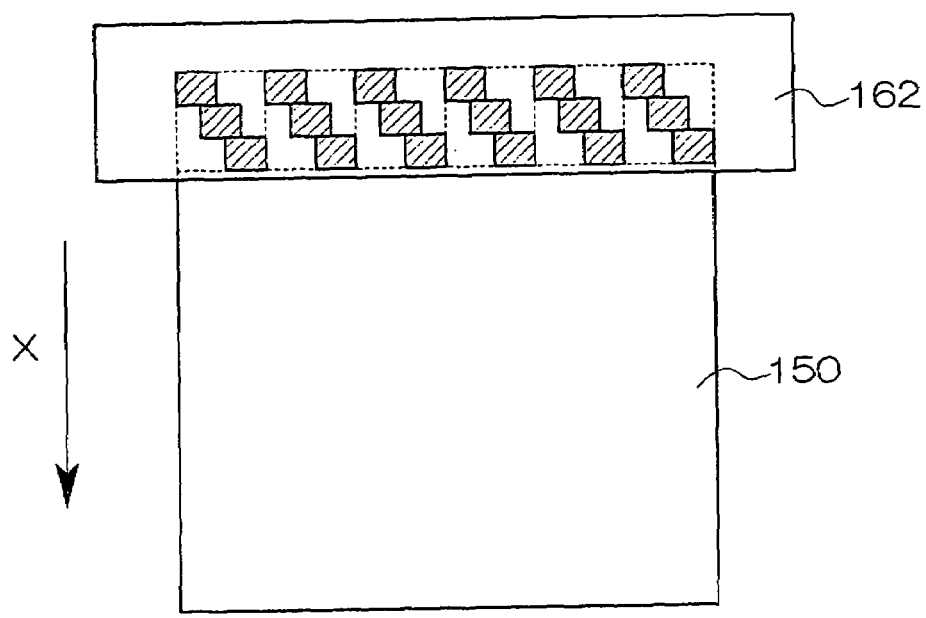
FIG. 12 is a plan view for describing an exposure method by which a photosensitive material is exposed by one-time scanning with a scanner.
Figure 13A:
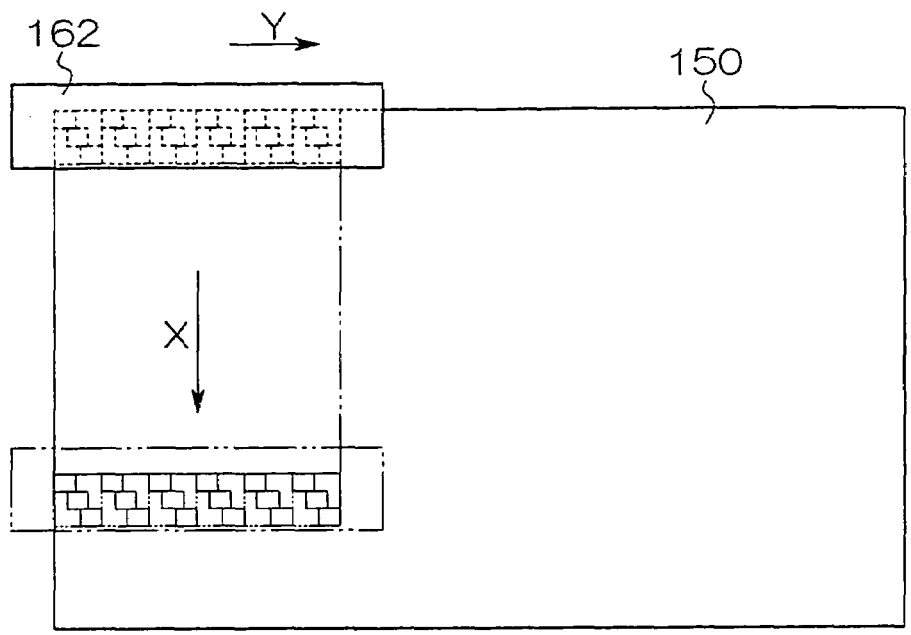
FIGS. 13A and 13B are plan views for describing an exposure method by which a photosensitive material is exposed by plural scannings with the scanner.
Figure 13B:
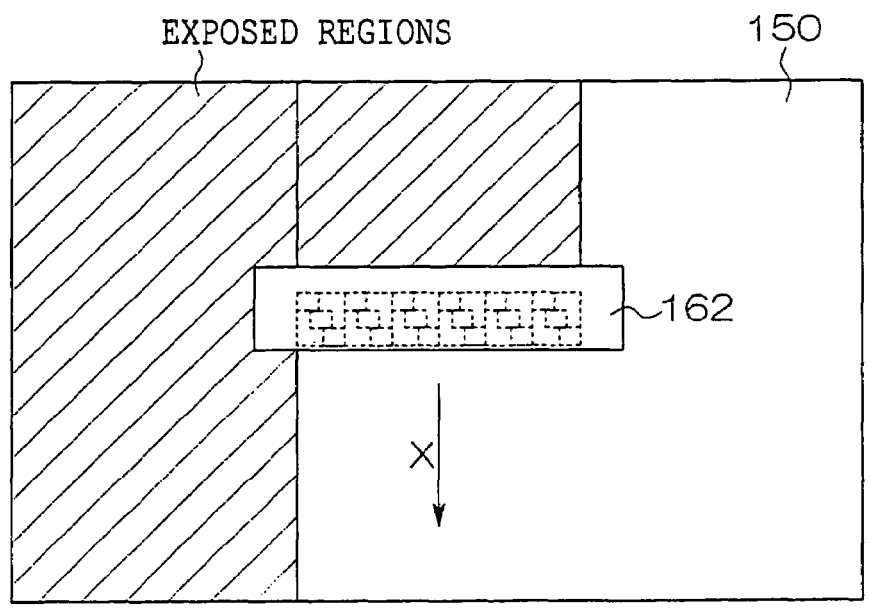

In the above-described embodiments, description was given in regard to an example where, as shown in FIG. 12, the entire surface of the substrate 150 was exposed by one-time scanning in the X direction with the scanner 162; however, as shown in FIG. 13, the entire surface of the substrate 150 may also be exposed by plural scannings by repeating scanning and movement so that, after the substrate 150 has been scanned in the X direction by the scanner 162, the scanner 162 is moved one step in the Y direction and scanning is conducted in the X direction.

Also, in the above-described embodiments, an example was given of a so-called flatbed type image recording device, but a so-called outer drum type image recording device that includes a drum wound with a photosensitive material may also be used as the image recording device of the invention.

Purposes such as exposure of a dry film resist (DFR) in the fabrication process of a printed wiring board (PWB), formation of a color filter in the fabrication process of a liquid crystal display (LCD), exposure of a DFR in the fabrication process of TFT and exposure of a DFR in the fabrication process of a plasma display panel (PDP) can be appropriately used in the above image recording device.

Also, any of a photon-mode photosensitive material where information is directly recorded by exposure and a heat-mode photosensitive material where information is recorded by heat generated by exposure can also be used in the above image recording device. In a case where a photon-mode photosensitive material is used, a GaN semiconductor laser or a wavelength-variable solid-state laser is used for the laser device, and in a case where a heat-mode photosensitive material is used, an AlGaAs semiconductor laser (infrared laser) or a solid-state laser is used for the laser device.

With the present invention, substrates of different sizes can be reliably sucked to a stage by effectively using the suction force resulting from negative pressure.

What is claimed is:

1. A suction mechanism for retaining a photosensitive tabular member including:
   (a) a stage that includes an upper surface for placing the photosensitive tabular member, a suction path at least partially disposed along the stage, and plural suction holes that are connected to the suction path and are defined in the stage upper surface;
   (b) a suction unit that is connected to the suction path and is operable for applying a reduced pressure to the suction path; and
   (c) mechanically-operated valve members disposed in the respective suction holes, with each valve member being capable of moving between an open position that substantially allows a fluid connection between the stage upper surface side and the suction path and a closed position that substantially blocks the fluid connection,
   (d) wherein when the photosensitive tabular member is placed on the stage upper surface, only the valve members positioned in a projection region of the photosensitive tabular member on the stage upper surface move to the closed position on the basis of at least one of the self weight of the photosensitive tabular member and an external force applied to the photosensitive tabular member.

2. The suction mechanism of claim 1, further including urging members that respectively urge the valve members to the closed position.

3. The suction mechanism of claim 1, wherein the valve members directly contact the photosensitive tabular member and can be moved to the open position by the photosensitive tabular member.

4. The suction mechanism of claim 1, wherein the valve members are ordinarily positioned in the closed position, at which they protrude by a predetermined amount from the stage upper surface.

5. The suction mechanism of claim 1, wherein the valve members can reciprocally move in a direction substantially perpendicular to the stage upper surface.

6. The suction mechanism of claim 1, wherein the valve members can operate in an open-door manner with respect to the stage upper surface.

7. The suction mechanism of claim 1, wherein the stage upper surface is substantially flat in order to support the photosensitive tabular member.

8. The suction mechanism of claim 1, wherein the stage upper surface is a curved surface.

9. The suction mechanism of claim 1, wherein the suction unit includes a vacuum pump.

10. An image recording device for recording an image on a photosensitive tabular substrate including:
    (a) a stage for retaining the substrate during image recording, the stage including an upper surface for placing the substrate, a suction path at least partially disposed along the stage, and plural suction holes that are connected to the suction path and are defined in the stage upper surface;
    (b) a suction unit that is connected to the suction path and is operable for applying a reduced pressure to the suction path; and
    (c) mechanically-operated valve members disposed in the respective suction holes, with each valve member being capable of moving between an open position that substantially allows a fluid connection between the stage upper surface side and the suction path and a closed position that substantially blocks the fluid connection,
    (d) wherein when the substrate is placed on the stage upper surface, only the valve members positioned in a projection region of the substrate on the stage upper surface move to the closed position on the basis of at least one of the self weight of the substrate and an external force applied to the substrate.

11. The image recording device of claim 10, further including exposure heads for exposing the substrate.

12. The image recording device of claim 11, wherein each exposure head includes plural digital micromirror devices.

13. The image recording device of claim 10, further including a fiber array light source that emits laser light for image recording.

14. The image recording device of claim 10, further including urging members that respectively urge the valve members to the closed position.

15. The image recording device of claim 10, wherein the valve members directly contact the substrate and can be moved to the open position by the substrate.

16. The image recording device of claim 10, wherein the valve members are ordinarily positioned in the closed position, at which they protrude by a predetermined amount from the stage upper surface.

17. The image recording device of claim 10, wherein the valve members can reciprocally move in a direction substantially perpendicular to the stage upper surface.

18. The image recording device of claim 10, wherein the valve members can operate in an open-door manner with respect to the stage upper surface.

19. The image recording device of claim 10, wherein the stage upper surface is substantially flat in order to support the substrate.

20. The image recording device of claim 10, wherein the suction unit includes a vacuum pump.

* * * * *